(12) United States Patent
Watanabe et al.

(10) Patent No.: US 11,145,522 B2
(45) Date of Patent: Oct. 12, 2021

(54) METHOD OF FORMING BORON-BASED FILM, AND FILM FORMING APPARATUS

(71) Applicant: TOKYO ELECTRON LIMITED, Tokyo (JP)

(72) Inventors: Yoshimasa Watanabe, Nirasaki (JP); Masahiro Oka, Nirasaki (JP); Hirokazu Ueda, Nirasaki (JP); Yuuki Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 43 days.

(21) Appl. No.: 16/263,236

(22) Filed: Jan. 31, 2019

(65) Prior Publication Data

US 2019/0244838 A1    Aug. 8, 2019

(30) Foreign Application Priority Data

Feb. 5, 2018  (JP) .............................. JP2018-018018

(51) Int. Cl.
*C23C 16/511*  (2006.01)
*C23C 16/02*  (2006.01)
(Continued)

(52) U.S. Cl.
CPC .... *H01L 21/67063* (2013.01); *C23C 16/0236* (2013.01); *C23C 16/401* (2013.01);
(Continued)

(58) Field of Classification Search
CPC ..... C23C 16/301; C23C 16/38; C23C 16/342; C23C 16/455; C23C 16/45502;
(Continued)

(56) References Cited

U.S. PATENT DOCUMENTS

| 6,383,465 B1 * | 5/2002 | Matsumoto ........... C01B 21/064 423/290 |
| 8,247,332 B2 * | 8/2012 | Rangarajan ....... H01L 21/02112 438/694 |
| 10,388,524 B2 * | 8/2019 | Ueda ................... C23C 16/5096 |
| 10,418,243 B2 * | 9/2019 | Kulshreshtha ...... H01L 21/0335 |

(Continued)

FOREIGN PATENT DOCUMENTS

| JP | 2013533376 A | 8/2013 |
| KR | 10-1998-063389 A | 10/1998 |

OTHER PUBLICATIONS

Vivek Soni; Tension and Compression, tensile and compressive stress and strain, Stress-Strain curve for tensile testing; Mechanical Master; retrieved from www.mechanical classes.com/2017/11/tension-and-compression-tensile-and.html; 7 pages, Nov. 5, 2017.*

(Continued)

*Primary Examiner* — Dah-Wei D. Yuan
*Assistant Examiner* — Nga Leung V Law
(74) *Attorney, Agent, or Firm* — Nath, Goldberg & Meyer; Jerald L. Meyer; Tanya E. Harkins

(57) ABSTRACT

A method of forming a boron-based film includes forming the boron-based film mainly containing boron on a substrate by plasma CVD using plasma of a processing gas including a boron-containing gas; and controlling film stress of the formed boron-based film by adjusting a process parameter.

11 Claims, 8 Drawing Sheets

(51) Int. Cl.
*C23C 16/40* (2006.01)
*C23C 16/455* (2006.01)
*H01L 21/67* (2006.01)
*H01L 21/02* (2006.01)
*H01L 21/311* (2006.01)

(52) U.S. Cl.
CPC .......... *C23C 16/455* (2013.01); *C23C 16/511* (2013.01); *H01L 21/02112* (2013.01); *H01L 21/02129* (2013.01); *H01L 21/02274* (2013.01); *H01L 21/31144* (2013.01)

(58) Field of Classification Search
CPC ............ C23C 16/50–517; C23C 16/52; C23C 16/511; C23C 16/0236; C23C 16/401; C23C 16/28; C23C 16/45536; H01L 21/02112; H01L 21/02274; H01L 21/67063; H01L 21/31144; H01L 21/02129; H01L 21/67017
USPC ....... 427/523, 530, 531, 562, 564, 569, 575, 427/576
See application file for complete search history.

(56) References Cited

U.S. PATENT DOCUMENTS

| | | | |
|---|---|---|---|
| 2002/0100420 A1* | 8/2002 | Burger | C23C 28/044 118/723 E |
| 2009/0017640 A1* | 1/2009 | Huh | H01L 21/76814 438/783 |
| 2009/0022969 A1* | 1/2009 | Zhang | C23C 16/279 428/216 |
| 2010/0233633 A1* | 9/2010 | Nguyen | C23C 16/45523 430/323 |
| 2011/0135557 A1* | 6/2011 | Rangarajan | H01L 21/31144 423/345 |
| 2017/0103893 A1* | 4/2017 | Kulshreshtha | H01L 21/0338 |
| 2018/0174838 A1* | 6/2018 | Ueda | C23C 16/38 |
| 2019/0301019 A1* | 10/2019 | Watanabe | C23C 16/50 |

OTHER PUBLICATIONS

"Compressive Stress-definition, formula, units, dimensions and FAQ"; 4 pages; retrieved from www.vedantu.com/physics/compressive-stress; no date but retrieved Sep. 10, 2020.*

* cited by examiner

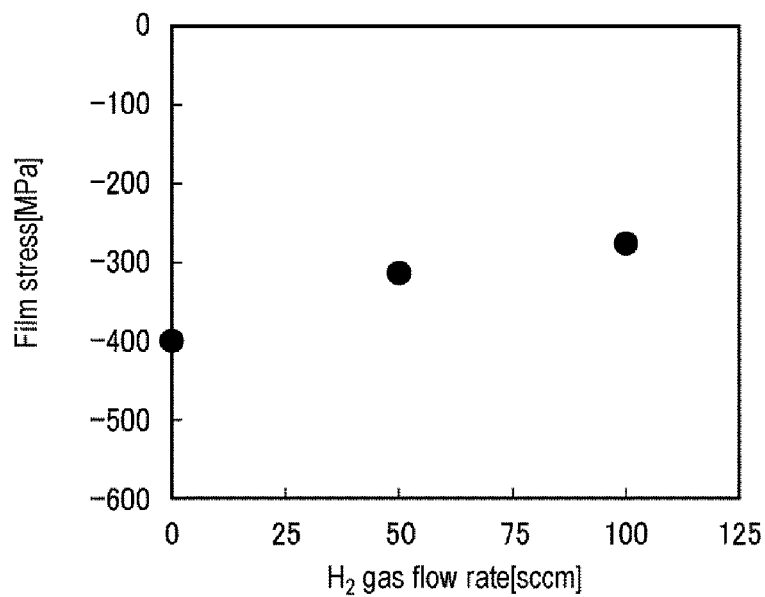
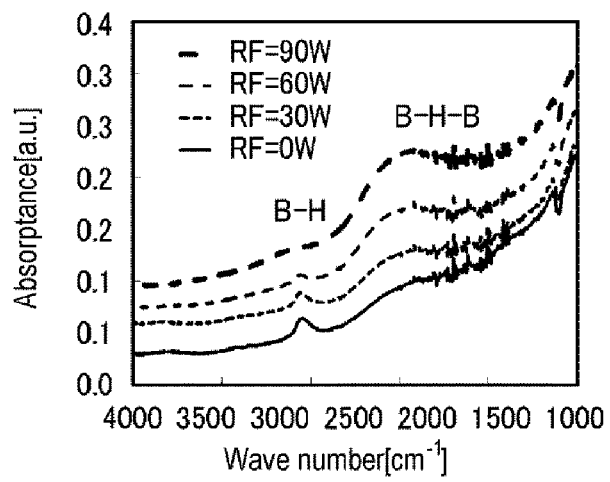

METHOD OF FORMING BORON-BASED FILM, AND FILM FORMING APPARATUS

CROSS-REFERENCE TO RELATED APPLICATION

This application is based upon and claims the benefit of priority from Japanese Patent Application No. 2018-018018, filed on Feb. 5, 2018, the entire contents of which are incorporated herein by reference.

TECHNICAL FIELD

The present disclosure relates to a method of forming a boron-based film, and a film forming apparatus.

BACKGROUND

In recent years, by virtue of the development of semiconductor manufacturing technology, as miniaturization of semiconductor devices has progressed, semiconductor devices having a size of 14 nm or less, further 10 nm or less, have appeared. In addition, techniques for three-dimensionally constructing semiconductor elements for further integration of semiconductor devices are being advanced. Therefore, the number of stacked thin films to be formed on a semiconductor wafer is increased. Further, for example, for a flash memory using three-dimensional NAND, there is a need of a process of micro-fabricating a thick stacked film having a thickness of 1 μm or more and including a silicon oxide ($SiO_2$) film, a silicon nitride (SiN) film and the like by dry etching.

Conventionally, an amorphous silicon film or an amorphous carbon film has been used as a hard mask for micro-fabrication, but their etching resistance is low. Therefore, when these films are used as the hard mask, the film thickness has to be increased and it is necessary to form a film having a thickness of 1 μm or more.

Further, as the next-generation hard mask material, a metal material film such as a tungsten film having higher etching resistance than the amorphous silicon film or the amorphous carbon film has been studied. However, the metal material film such as the tungsten film highly resistant to etching has difficulty in coping with peeling-off after dry etching processing, metal contamination and so on.

For this reason, a boron-based film has been studied as a new hard mask material having higher dry etching resistance than the amorphous silicon film or the amorphous carbon film and having higher selectivity with respect to the $SiO_2$ film, the SiN film and the like. There has been conventionally proposed a technique for forming a boron-based film as a hard mask by Chemical Vapor Deposition (CVD).

By the way, since the boron-based film has higher selectivity with respect to the $SiO_2$ film, the SiN film and the like as described above, application of the boron-based film to various films in addition to the hard mask has been studied. For example, in semiconductor devices, strain engineering that distorts Si crystal lattices is being used to improve the carrier mobility in MOSFET, and application to a film utilizing film stress such as a strain inducing film used at this time, a counter film of a wafer with warpage due to stress, or the like may be considered. However, when the boron-based film is used as a hard mask material, the film stress is required to be small. For this reason, when the boron-based film is to be applied to a wide range of applications, it is desirable to control the film stress.

SUMMARY

Some embodiments of the present disclosure provide a method and apparatus for forming a boron-based film, which is capable of controlling film stress.

According to one embodiment of the present disclosure, there is provided a method of forming a boron-based film including forming the boron-based film mainly containing boron on a substrate by plasma CVD using plasma of a processing gas including a boron-containing gas; and controlling film stress of the formed boron-based film by adjusting a process parameter.

According to another embodiment of the present disclosure, there is provided a film forming apparatus for forming a boron-based film mainly containing boron on a substrate, including a chamber in which a substrate is accommodated; a mounting table configured to support the substrate in the chamber; a gas supply mechanism configured to supply a processing gas including a boron-containing gas into the chamber; an exhaust device configured to exhaust an interior of the chamber, a plasma generating part configured to generate plasma in the chamber; a bias voltage applying high frequency power supply configured to apply high frequency power to the mounting table and apply a bias voltage to the substrate on the mounting table; and a control part configured to control film stress of the boron-based film formed on the substrate by adjusting the power of the bias voltage applying high frequency power supply.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a view showing the relationship between the amount of $H_2$ gas added to $B_2H_6$ gas and film stress.

FIGS. 9A to 9C are views showing results of FT-IR measurement of boron films having different process conditions in order to evaluate H atom concentration and bonding state in a boron film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes for carrying out the present disclosure will be described with reference to the accompanying drawings.

<Circumstances Leading to the Present Disclosure>

First, the circumstances in which the inventors come up with to the present disclosure will be described. A boron-based film is promising as a hard mask and has been conventionally formed by CVD. Among boron-based films, in particular, a boron film of boron alone has been found to have excellent characteristics.

On the other hand, since the boron-based film has a high selectivity to a $SiO_2$ film, a SiN film and the like, application thereof as various films besides the hard mask has been studied. For example, application to a film utilizing film stress such as a strain inducing film used for strain engineering, a counter film of a wafer with warpage due to stress, or the like may be considered. However, when the boron-based film is used as a hard mask material, the film stress is required to be small. For this reason, in order for the boron-based film represented by a boron film to be applied to a wide range of applications in the future, it is desirable to control the film stress.

As a result of research, the inventors has arrived at a conclusion that it is possible to control the film stress by forming a boron-based film by plasma CVD and adjusting the process parameters at that time to change the bonding state of boron atoms in the film. In particular, it has been found that it is most effective to change a bias voltage applied to a workpiece.

In the present disclosure, a boron-based film to be formed is a film consisting mainly of boron at 50 at. % or more. For example, it may be a boron film composed of boron and inevitable impurities or may be a film composed of boron and other intentional additive elements such as nitrogen (N), carbon (C), silicon (Si) and the like. However, from the viewpoint of obtaining high etching resistance, a boron film containing no other additive elements is preferably used. The following embodiments will be described by way of an example in which a boron film containing no additive elements is used as a boron-based film.

First Embodiment

[Film Forming Apparatus]

Figure 1:
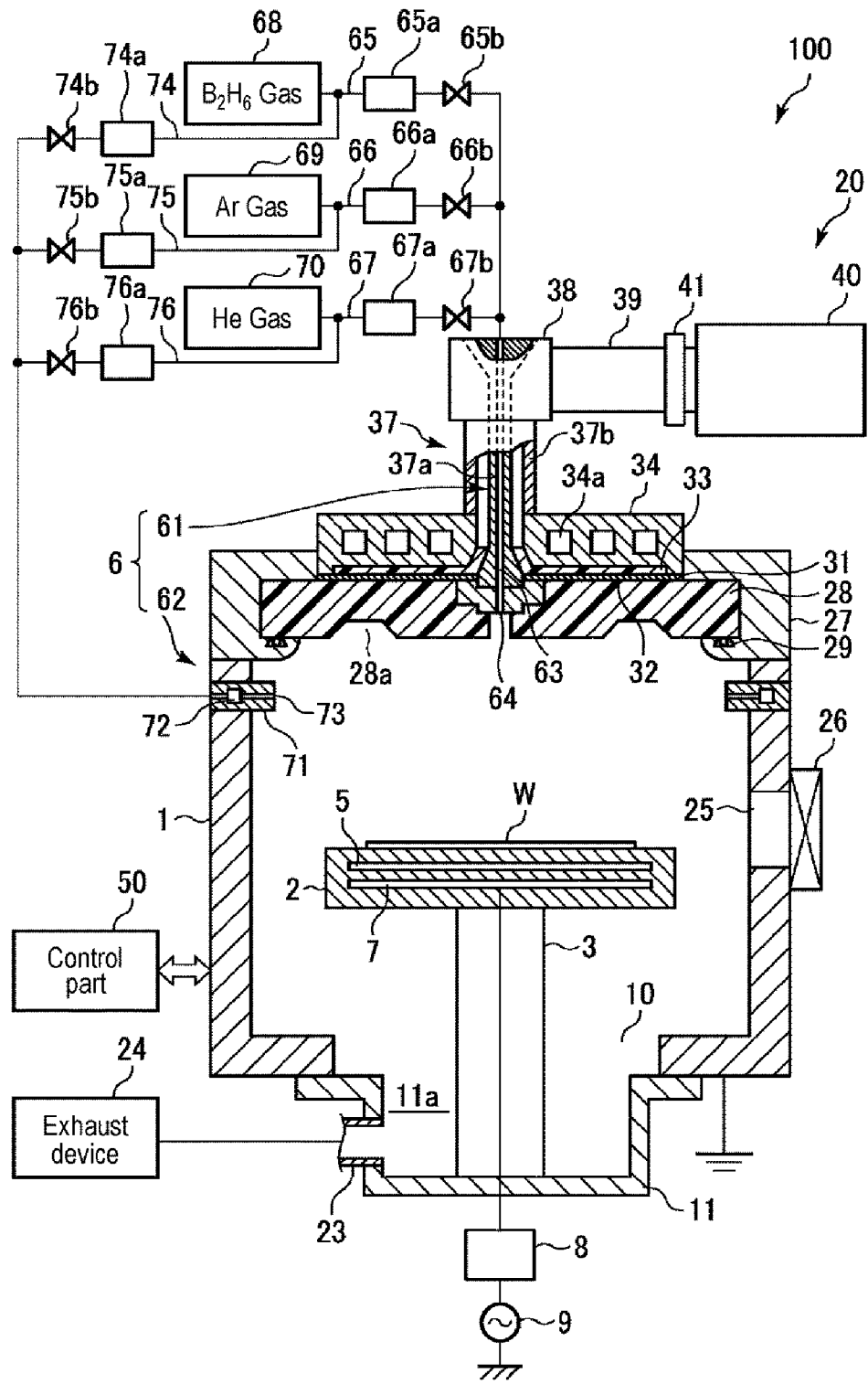
FIG. 1 is a sectional view showing a film forming apparatus used in a first embodiment of the present disclosure.

FIG. 1 is a sectional view showing a film forming apparatus used in a first embodiment of the present disclosure. The film forming apparatus 100 of this example is configured as a microwave plasma CVD apparatus for forming a boron film.

This film forming apparatus 100 has substantially a cylindrical chamber 1 which is airtight and grounded. The chamber 1 is made of a metal material such as aluminum, its alloy or the like. A microwave plasma source 20 is installed above the chamber 1. The microwave plasma source 20 is configured, for example, as an RLSA® microwave plasma source.

A circular opening 10 is formed substantially at the central portion of the bottom wall of the chamber 1 and an exhaust chamber 11 communicating to the opening 10 and projecting downward is installed in the bottom wall.

A disc-shaped mounting table 2 made of ceramics such as AlN or the like for horizontally supporting a wafer W as a workpiece is installed in the chamber 1. The mounting table 2 is supported by a support member 3 made of ceramics such as cylindrical AlN extending upward from the center of the bottom of the exhaust chamber 11. A heater 5 of a resistance heating type is buried in the mounting table 2. This heater 5 generates heat with power fed from a heater power supply (not shown), whereby the wafer W is heated to a predetermined temperature via the mounting table 2. An electrode 7 is buried in the mounting table 2, and a high frequency power supply 9 for applying a bias voltage is connected to the electrode 7 via a matching device 8. The bias voltage applying high frequency power supply 9 applies high frequency power (high frequency bias) of 3 to 13.56 MHz, specifically, 3 MHz, to the mounting table 2. The power of the high frequency bias is variable and can be varied in a range of 0 to 90 W, for example. The matching device 8 is provided to match the load impedance with the internal (or output) impedance of the bias voltage applying high frequency power supply 9. Specifically, when plasma is generated in the chamber 1, the matching device 8 serves to apparently match the load impedance with the internal impedance of the bias voltage applying high frequency power supply 9.

Wafer supporting pins (not shown) for supporting and moving up and down the wafer W are installed in the mounting table 2 so as to protrude and retract from the surface of the mounting table 2.

An exhaust pipe 23 is connected to the side surface of the exhaust chamber 11, and an exhaust device 24 including a vacuum pump, an automatic pressure control valve and the like is connected to the exhaust pipe 23. By actuating the vacuum pump of the exhaust device 24, a gas in the chamber 1 is uniformly discharged into the space 11a of the exhaust chamber 11 and is exhausted through the exhaust pipe 23. The internal pressure of the chamber 1 is controlled to a predetermined degree of vacuum by the automatic pressure control valve.

A loading/unloading port 25 for loading/unloading the wafer W between the chamber 1 and a vacuum transfer chamber (not shown) adjacent to the film forming apparatus 100 is installed in the side wall of the chamber 1. The loading/unloading port 25 is opened and closed by a gate valve 26.

The upper portion of the chamber 1 corresponds to an opening, and the peripheral portion of the opening corresponds to a ring-shaped support 27. The microwave plasma source 20 is supported by the support 27.

The microwave plasma source 20 includes a disc-shaped microwave-transmitting plate 28 made of a dielectric material, for example, ceramics such as quartz or $Al_2O_3$, a planar slot antenna 31 having a plurality of slots, a slow-wave member 33, a coaxial waveguide pipe 37, a mode converter 38, a waveguide pipe 39 and a microwave generator 40.

The microwave-transmitting plate 28 is air-tightly installed on the support 27 via a seal member 29, so that the chamber 1 is kept airtight.

The planar slot antenna 31 has a disc shape corresponding to the microwave-transmitting plate 28 and is installed so as to be in close contact with the microwave-transmitting plate 28. The planar slot antenna 31 is locked to the upper end of the side wall of the chamber 1. The planar slot antenna 31 is formed of a disc made of a conductive material.

The planar slot antenna 31 is composed of, for example, a copper or aluminum plate whose surface is silver or gold-plated, and is formed with a plurality of slots 32 for emitting a microwave that penetrate therethrough in a predetermined pattern. The pattern of the slots 32 is appropriately set so that the microwave is evenly emitted. For example, as an example of the pattern, a plurality of pairs of slots 32 may be arranged concentrically with a pair of two slots 32 arranged in a T shape. The length and the arrangement interval of the slots 32 are determined according to the effective wavelength (λg) of the microwave. For example, the slots 32 are arranged so that their intervals are λ/4, λ/2 or λg. In addition, the slots 32 may have other shapes such as a circular shape, an arc shape and the like. Further, the arrangement form of the slots 32 is not particularly limited but they may be arranged, for example, in a spiral shape or a radial shape other than the concentric shape.

The slow-wave member 33 is installed in close contact with the upper surface of the planar slot antenna 31. The slow-wave member 33 is made of a dielectric material having a dielectric constant larger than that of vacuum, such as quartz, ceramics ($Al_2O_3$), polytetrafluoroethylene, polyimide or the like. The slow-wave member 33 serves to make the wavelength of the microwave shorter than that in vacuum to reduce the size of the planar slot antenna 31.

The thicknesses of the microwave-transmitting plate 28 and the slow-wave member 33 are adjusted such that an equivalent circuit formed by the slow-wave member 33, the planar slot antenna 31, the microwave-transmitting plate 28 and plasma satisfies the resonance conditions. The phase of the microwave can be adjusted by adjusting the thickness of the slow-wave member 33, and the microwave reflection is minimized and the microwave radiation energy is maximized by adjusting the thickness so that the junction of the planar slot antenna 31 becomes an "antinode" of a standing wave. Further, the interface reflection of the microwave can be prevented by making the slow-wave member 33 and the microwave-transmitting plate 28 with the same material.

The space between the planar slot antenna 31 and the microwave-transmitting plate 28 and the space between the slow-wave member 33 and the planar slot antenna 31 may be spaced apart from each other.

A cooling jacket 34 made of a metal material such as aluminum, stainless steel, copper or the like is installed on the upper surface of the chamber 1 so as to cover the planar slot antenna 31 and the slow-wave member 33. A cooling water flow path 34a is formed in the cooling jacket 34. The slow-wave member 33, the planar slot antenna 31 and the microwave-transmitting plate 28 are cooled by passing cooling water through the cooling water flow path 34a.

The coaxial waveguide pipe 37 is inserted toward the microwave-transmitting plate 28 from above the opening formed at the center of the upper wall of the cooling jacket 34. The coaxial waveguide pipe 37 is composed of a hollow rod-shaped inner conductor 37a and a cylindrical outer conductor 37b which are arranged concentrically. The lower end of the inner conductor 37a is connected to the planar slot antenna 31. The coaxial waveguide pipe 37 extends upward.

The mode converter 38 is connected to the upper end of the coaxial waveguide pipe 37. One end of the waveguide pipe 39 extending horizontally and having a rectangular section is connected to the mode converter 38. The microwave generator 40 is connected to the other end of the waveguide pipe 39. A matching circuit 41 is disposed on the waveguide pipe 39.

The microwave generator 40 generates a microwave having a frequency of, e.g., 2.45 GHz, the generated microwave propagates in the waveguide pipe 39 in the TE mode, and the vibration mode of the microwave is converted from the TE mode to the TEM mode in the mode converter 38 and propagates toward the slow-wave member 33 via the coaxial waveguide pipe 37. Then, the microwave spreads radially outward in the slow-wave member 33 in the radial direction, is radiated from the slots 32 of the planar slot antenna 31, passes through the microwave-transmitting plate 28, and generates an electric field in a region directly under the microwave-transmitting plate 28 to produce microwave plasma. An annular concave portion 28a recessed in a taper shape for facilitating generation of a standing wave due to the introduced microwave is formed on a portion of the lower surface of the microwave-transmitting plate 28, so that the microwave plasma can be efficiently produced.

In addition to the frequency of 2.45 GHz, various frequencies such as 8.35 GHz, 1.98 GHz, 860 MHz, 915 MHz, etc. can be used as the frequency of the microwave. The microwave power is preferably 2,000 to 5,000 W and the power density is preferably 2.8 to 7.1 $W/cm^2$.

The film forming apparatus 100 includes a gas supply mechanism 6 for supplying a processing gas including a boron-containing gas. Examples of the boron-containing gas may include a diborane ($B_2H_6$) gas, a boron trichloride ($BCl_3$) gas, an alkylborane gas, a decaborane gas and the like. Examples of the alkylborane gas may include a trimethylborane ($B(CH_3)_3$) gas, a triethylborane ($B(C_2H_5)_3$) gas, a gas expressed by $B(R1)(R2)(R3)$, $B(R1)(R2)H$ or $B(R1)H_2$ (R1, R2 and R3 are alkyl groups), and the like. Among these, the $B_2H_6$ gas may be suitably used.

In addition, the processing gas includes a rare gas for plasma excitation. Further, the processing gas may include a $H_2$ gas or the like. A He gas, an Ar gas or the like is used as the rare gas. Hereinafter, a case where the processing gas including the $B_2H_6$ gas as the boron-containing gas and the Ar gas and the He gas as the rare gas is used will be described by way of an example.

The gas supply mechanism 6 includes a first gas supply part 61 for discharging a gas toward the center of the wafer W and a second gas supply part 62 for discharging a gas from the outside of the wafer W. The first gas supply part 61 includes a gas flow path 63 formed inside the mode converter 38 and the inner conductor 37a of the coaxial waveguide pipe 37. A gas supply port 64 at the leading end of the gas flow path 63 is opened into the chamber 1, for example, in the central portion of the microwave-transmitting plate 28. Pipes 65, 66 and 67 are connected to the gas flow path 63. A $B_2H_6$ gas supply source 68 for supplying the $B_2H_6$ gas as the boron-containing gas is connected to the pipe 65, an Ar gas supply source 69 for supplying the Ar gas as the rare gas is connected to the pipe 66, and a He gas supply source 70 for supplying the He gas as the rare gas is connected to the pipe 67. A flow rate controller 65a, such as a mass flow controller, and an opening/closing valve 65b are installed in the pipe 65, a flow rate controller 66a and an opening/closing valve 66b are installed in the pipe 66, and a flow rate controller 67a and an opening/closing valve 67b are installed in the pipe 67.

The second gas supply part 62 includes a shower ring 71 installed in a ring shape along the inner wall of the chamber 1. The shower ring 71 is provided with an annular buffer chamber 72 and a plurality of gas discharge ports 73 installed so as to face the interior of the chamber 1 at equal intervals from the buffer chamber 72. Pipes 74, 75 and 76 are branched from the pipes 65, 66 and 67, respectively, and are joined and connected to the buffer chamber 72 of the shower ring 71. A flow rate controller 74a and an opening/closing valve 74b are installed in the pipe 74, a flow rate controller 75a and an opening/closing valve 75b are installed in the pipe 75, and a flow rate controller 76a and an opening/closing valve 76b are installed in the pipe 76.

In this example, the same types of boron-containing gases or rare gases with their respective flow rates adjusted are supplied from the same gas supply sources 68, 69 and 70 to the first gas supply part 61 and the second gas supply part 62 and are discharged into the chamber 1 from the center of the microwave-transmitting plate 28 and the peripheral edge of the chamber 1, respectively. It should be noted that gases can be separately supplied from the first gas supply part 61 and the second gas supply part 62 and the flow rates thereof can be individually adjusted.

A processing gas with a flow rate in a range of, for example, 1,000 to 10,000 sccm suitably 2,000 to 10,000 sccm in order to improve the deposition rate of a boron film, is supplied from the first and second gas supply parts 61 and 62.

The gas supply mechanism 6 includes all of the first and second gas supply parts 61 and 62, the $B_2H_6$ gas supply source 68, the Ar gas supply source 69, the He gas supply source 70, the pipes, the flow rate controllers, the valves and so on.

The film forming apparatus 100 includes a control part 50. The control part 50 controls various components of the film forming apparatus 100, such as the valves, the flow rate controllers, the microwave generator 40, the heater power supply, the bias voltage applying high frequency power supply 9 and so on. The control part 50 includes a main control part having a CPU, an input device, an output device, a display device and a storage device. A storage medium storing programs for controlling processes to be executed in the film forming apparatus 100, that is, processing recipes, is set in the storage device, and the main control part calls a predetermined processing recipe stored in the storage medium and controls the film forming apparatus 100 to perform a predetermined process based on the called processing recipe.

[Method of Forming Boron-Based Film in First Embodiment]

Next, a method of forming a boron film as a boron-based film, which is performed in the film forming apparatus 100 configured as above will be described.

First, the gate valve 26 is opened, the wafer W is loaded into the chamber 1 and is mounted on the mounting table 2, and the gate valve 26 is closed.

The temperature of the mounting table 2 is set to 500 degrees C. or less, specifically 60 to 500 degrees C., more specifically 300 degrees C. After the chamber 1 is evacuated, an Ar gas and a He gas are flowed into the chamber 1 to perform cycle purging, and the internal pressure of the chamber 1 by the Ar gas and the He gas is set to, for example, about 400 mTorr to stabilize the temperature of the wafer W. Then, plasma ignition is performed by introducing a microwave of 2,000 to 5,000 W (2.8 to 7.1 W/cm$^2$), specifically 3,500 W (5.0 W/cm$^2$), from the microwave generator 40. Thereafter, while maintaining the microwave power at the same value as that at the time of plasma ignition, the internal pressure of the chamber 1 is adjusted to 5 to 250 mTorr (0.67 to 33.3 Pa), specifically 50 mTorr (6.7 Pa), and a $B_2H_6$ gas ($B_2H_6$ concentration: 10 vol %) is supplied at a flow rate of 100 to 1,000 sccm, specifically 500 sccm and an Ar gas and a He gas are supplied at a total flow rate of 100 to 1,000 sccm, specifically 500 sccm from the first and second gas supply parts 61 and 62 to form the boron film as the boron-based film. The boron film formed at this time is usually amorphous boron (a-B). The deposition time of the boron film is appropriately set according to the film thickness.

Figure 2:
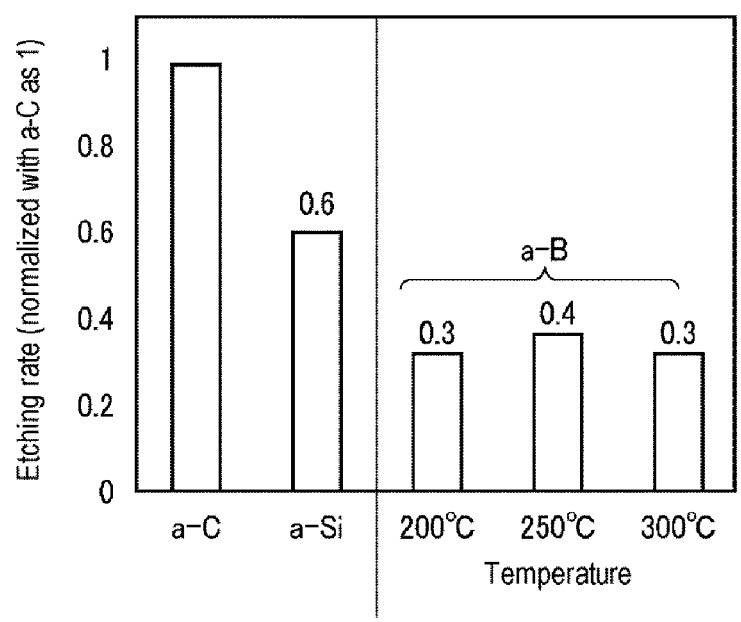
FIG. 2 is a view showing dry etching characteristics of a boron film formed by plasma CVD.
Figure 3:
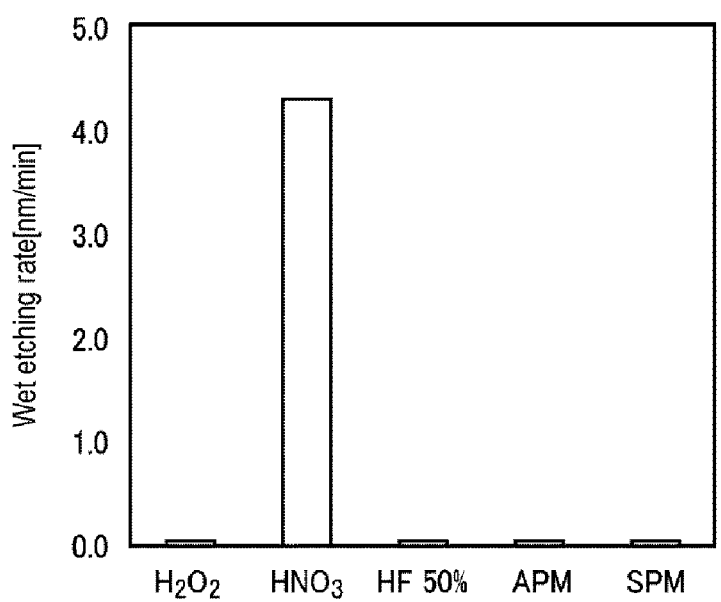
FIG. 3 is a view showing wet etching characteristics of a boron film formed by plasma CVD.

The boron film (amorphous boron a-B) formed by the plasma CVD has a higher selectivity with respect to a $SiO_2$ film or a SiN film at the time of dry etching. For example, as shown in FIG. 2, when the boron film is etched with a CF-based gas added appropriately with a gas such as Ar, $O_2$, $N_2$, $H_2$ or the like, the boron film has higher etching resistance than an amorphous carbon films (a-C) and an amorphous silicon film (a-Si) which have been conventionally used as a hard mask material. Further, as shown in FIG. 3, the boron film has high resistance to many chemical solutions other than nitric acid used for wet etching of the $SiO_2$ film and the SiN film. Therefore, by applying the boron film to a hard mask and the like, a semiconductor device can be easily manufactured.

In the boron film formation as described above, it is possible to control the film stress of the boron film to be formed by adjusting the process parameters at the time of film formation.

The most important process parameter for controlling the film stress of the boron film is the power of the high frequency bias applied to the wafer W from the bias voltage applying high frequency power supply 9.

Figure 4:
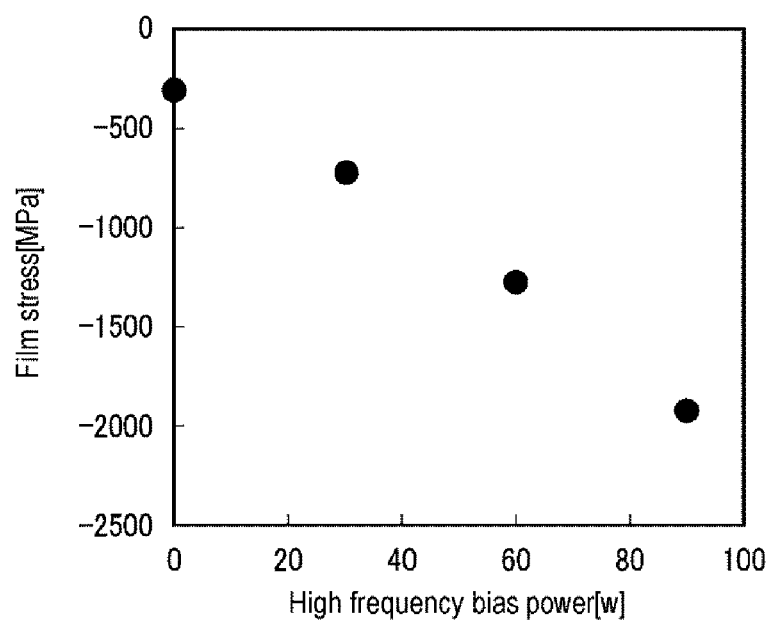
FIG. 4 is a view showing the relationship between high frequency bias power and film stress when a boron film is formed.

FIG. 4 is a view showing the relationship between high frequency bias power and film stress when the boron film is formed. The other process conditions are as follows: temperature: 300 degrees C., pressure: 50 mTorr (6.67 Pa), microwave power: 3 kW, $B_2H_6$ gas ($B_2H_6$ concentration: 10 vol %, He/Ar gas dilution) flow rate: 500 sccm, Ar gas flow rate: 400 sccm, He gas flow rate: 100 sccm. The negative direction of the stress is the compression direction. As shown in the figure, when the power of the high frequency bias is 0 W, the compressive stress is about 300 MPa, whereas the compressive stress increases as the high frequency bias power is increased. When the power becomes 90 W, the compressive stress exceeds 2,000 MPa (2 GPa). That is, by controlling the high frequency bias power to fall within a range of 0 to 90 W, it is possible to control the compressive stress of the boron film to a predetermined value up to 2 GPa.

When no high frequency bias is applied, since the compressive stress of the formed boron film is as small as about 300 MPa, the film stress is small (close to 0), which is suitable for a hard mask requiring the condition that the amount of wafer warpage should be small. When the power of the high frequency bias exceeds about 50 W, the compressive stress exceeds 1,000 MPa (1 GPa), which is suitable for a strain organic film and can function the boron film as a counter film of the wafer in which warpage occurs due to stress between 0 and 90 W.

Figure 5:
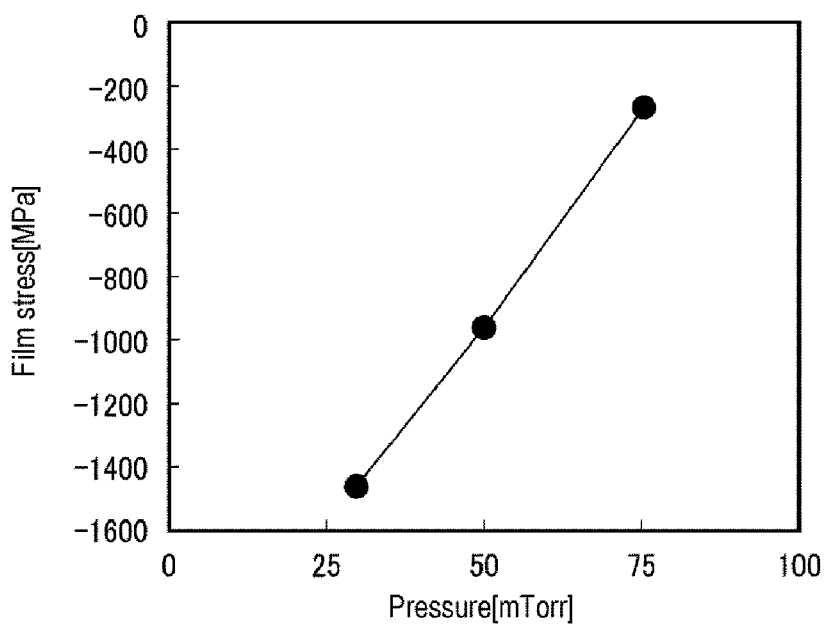
FIG. 5 is a view showing the relationship between pressure and film stress when a boron film is formed.
Figure 6:
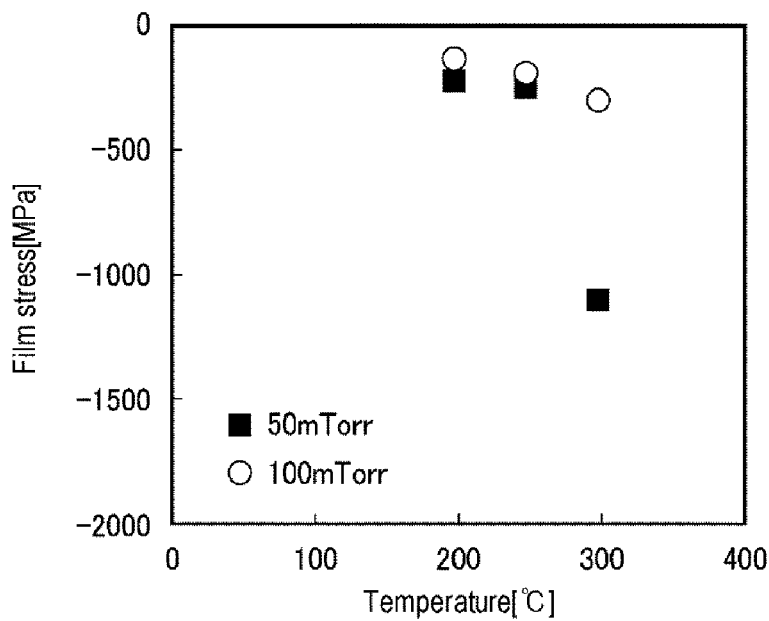
FIG. 6 is a view showing the relationship between temperature and film stress when a boron film is formed, in the case of temperature: 200 degrees C. and 300 degrees C. and pressure: 50 mTorr (6.65 Pa) and 100 mTorr (13.4 Pa)

Other parameters capable of controlling the film stress of the boron film may be pressure and temperature. FIG. 5 is a view showing the relationship between pressure and film stress when the boron film is formed. The other process conditions are as follows: temperature: 300 degrees C., microwave power: 3 kW, $B_2H_6$ gas ($B_2H_6$ concentration: 10 vol %, He/Ar gas dilution) flow rate: 500 sccm, Ar gas flow rate: 400 sccm, He gas flow rate: 100 sccm. As shown in the figure, when the pressure is 75 mTorr (1.0 Pa), the compressive stress is about 300 MPa, which is suitable for a hard mask. However, as the pressure decreases, the value of the compressive stress increases to about 1,500 MPa at a pressure of 30 mTorr (4 Pa). FIG. 6 is a view showing the relationship between temperature and film stress when the boron film is formed, with the process conditions that the temperature: 200 to 300 degrees C. and the pressure: 50 mTorr (6.65 Pa) and 100 mTorr (13.4 Pa). It can be seen from FIG. 6 that the film stress can be also controlled according to a change in temperature. From FIGS. 5 and 6, it can be seen that the compressive stress of the boron-based film can be controlled to fall within a range of 100 to 1.500 MPa within a pressure range of 30 mTorr (4 Pa) to 100 mTorr (13.3 Pa) and a temperature range of 200 to 300 degrees C.

Figure 7:
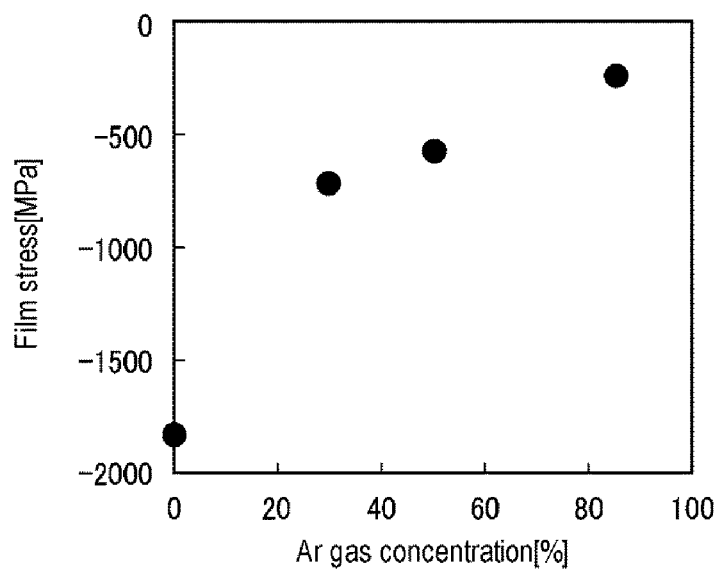
FIG. 7 is a view showing the relationship between the proportion of Ar gas in rare gas supplied together with a $B_2H_6$ gas as a processing gas and film stress.

Another parameter capable of controlling the film stress of the boron film is the type of a gas supplied as a processing gas together with the $B_2H_6$ gas. FIG. 7 is a view showing the relationship between the Ar gas concentration in a rare gas supplied as a processing gas together with the $B_2H_6$ gas and film stress. An Ar gas and a He gas are used as rare gases, in which case the He gas is 100% when the Ar gas is 0% and the He gas is 0% when the Ar gas is 100%. The other process conditions are temperature: 300 degrees C., pressure: 50 mTorr (6.67 Pa) and microwave power: 3 kW. As can be seen from the figure, when the Ar gas concentration in the rare gas (Ar gas and He gas) supplied together with the $B_2H_6$ gas is increased, the compressive stress decreases. Specifically, it can be seen that the compressive stress can be controlled to fall within a range of 120 MPa to 1,800 MPa by adjusting the ratio of the He gas and the Ar gas.

The film stress can be also controlled by adding a gas, for example, a $H_2$ gas, which does not react with the $B_2H_6$ gas. FIG. 8 is a view showing the relationship between the amount of $H_2$ gas added to the $B_2H_6$ gas and film stress. The other process conditions are as follows: temperature: 300 degrees C., pressure: 50 mTorr (6.67 Pa), microwave power: 3 kW, $B_2H_6$ gas ($B_2H_6$ concentration: 10 vol %, He/Ar gas dilution) flow rate: 500 sccm, Ar gas flow rate: 400 sccm, He gas flow rate: 100 sccm. As shown in the figure, as the amount of $H_2$ gas added increases, the compressive stress is alleviated.

As described above, the film stress of the boron film can be controlled to the compressive stress in the range of 120 MPa to 2 GPa by adjusting the process conditions in forming the boron film. It is believed that this is because the boron film formed by the plasma CVD mainly contains hydrogen (H) of about 5 to 15 at % as unavoidable impurities derived from the film forming material and the like in the film and the film stress depends on the concentration and binding state of H atoms.

Figure 9B:
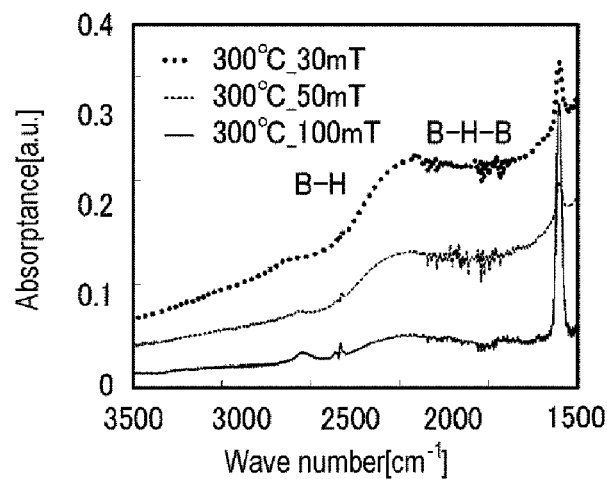
Figure 9C:
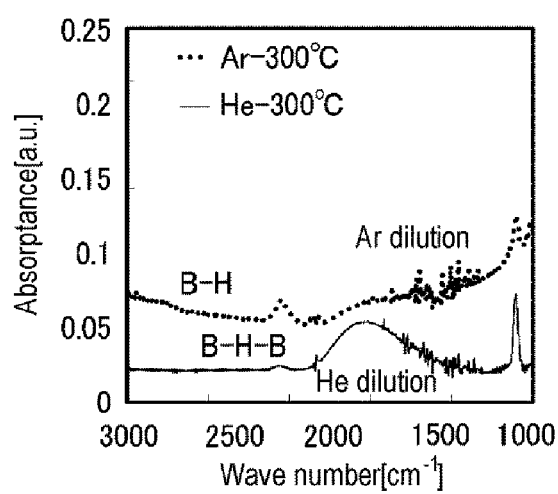

In order to evaluate the H atom concentration and bonding state in the boron film, FT-IR measurement of boron films with different process conditions was carried out. The results are shown in FIGS. 9A to 9C. FIG. 9A shows the result of measurement when the high frequency bias power is changed, FIG. 9B shows the result of measurement when the pressure is changed, and FIG. 9C shows the result of measurement when the rare gases for diluting the $B_2H_6$ gas are an Ar gas and a He gas. In all cases, it was revealed that the smaller the film stress is, the larger peak of B—H bonding is. It was also revealed that there was a tendency that the B—H bonding decreases and the B—H—B bonding increases as the film stress increases.

Figure 10:
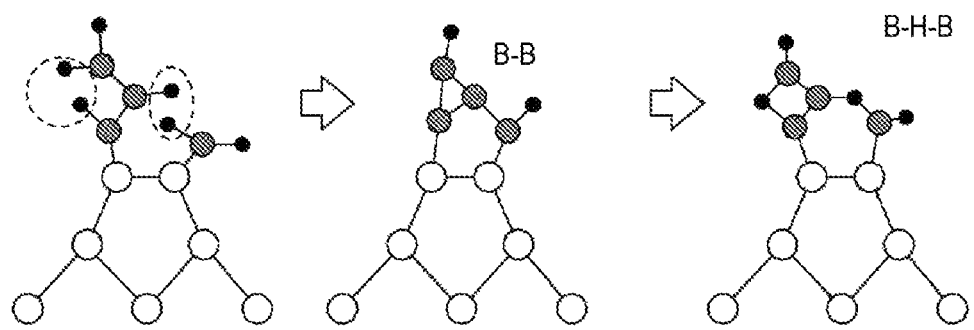
FIG. 10 is a view for explaining a mechanism of a change in film stress of a boron film.

With this result, a mechanism in which the film stress of the boron film changes will be described with reference to FIG. 10. It is thought that since a film containing many B—H bonds is H-terminated, it has a structure that relaxes easily but has decreased B—H bonds and increased B—B bonds. Further, applying a high frequency bias to the wafer W, or the like changes the B—B bonds into the B—H—B bonds. Accordingly, it is believed that the H termination is decreased so that the film structure cannot be changed, which results in an increase in the film stress.

As described above, according to the present embodiment, it is possible to form a boron film by plasma CVD and control the film stress of the obtained boron film by adjusting the process conditions of the plasma CVD. Since the boron film formed by the plasma CVD has 2 to 3 times higher selectivity with respect to $SiO_2$ film or SiN film as compared with a-C and a-Si conventionally used as a hard mask material, the boron film becomes suitable for a hard mask by controlling the boron film to have small film stress. In addition, by controlling the boron film to have large film stress, the boron film can be used as a strain organic film by using its high dry etching resistance and wet etching resistance, rather than removing it after functioning as a hard mask. Further, since the film stress can be controlled in this manner, by controlling the film stress to an appropriate value, the boron film can be used as a counter film of a wafer with warpage due to stress.

Second Embodiment

[Film Forming Apparatus

Figure 11:
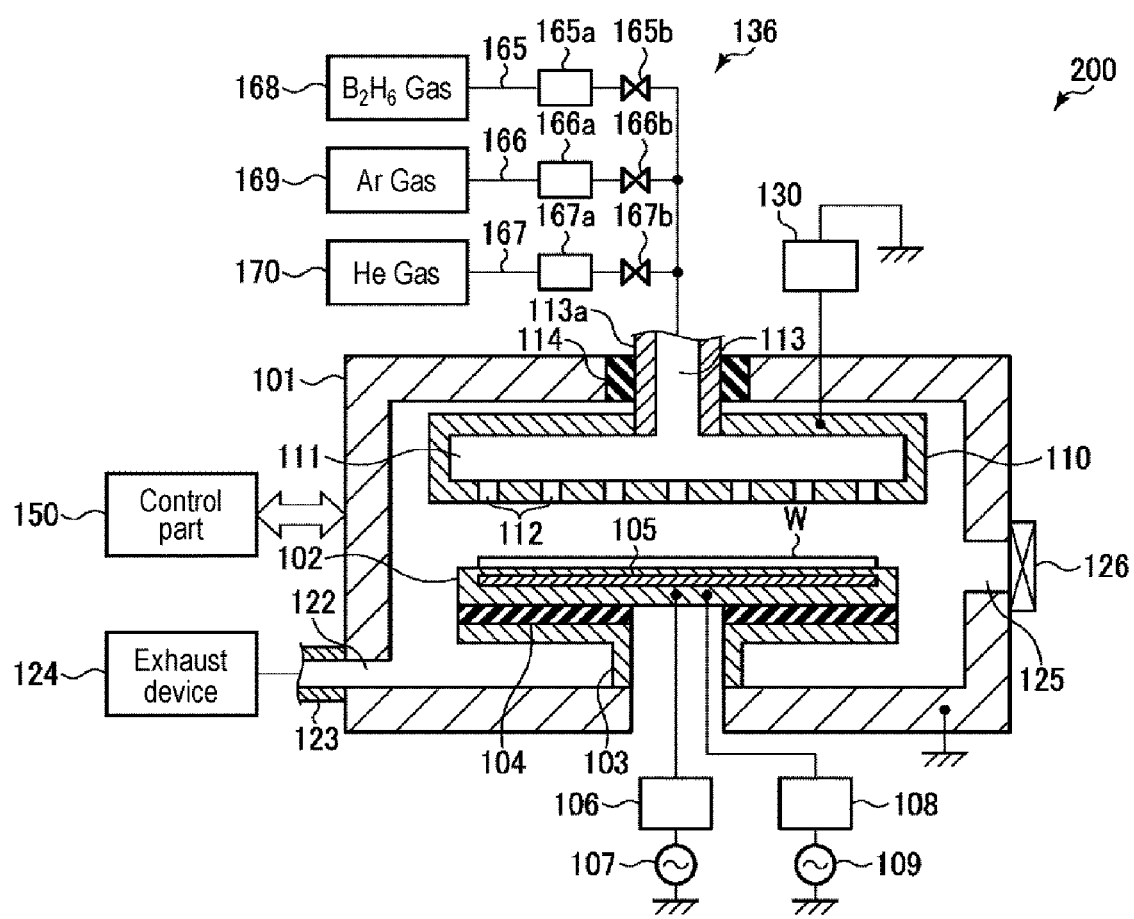
FIG. 11 is a sectional view showing a film forming apparatus used in a second embodiment of the present disclosure.

FIG. 11 is a sectional view showing a film forming apparatus used in a second embodiment of the present disclosure. The film formation apparatus 200 of this example is configured as a capacitively-coupled parallel plate plasma CVD apparatus for forming a boron film as a boron-based film.

This film forming apparatus 200 has substantially a cylindrical chamber 101 which is airtight and grounded. The chamber 101 is made of a metal material such as aluminum, its alloy or the like.

A mounting table 102 functioning as a lower electrode for horizontally supporting a wafer W as a workpiece is installed at the bottom of the chamber 101. The mounting table 102 is supported by a metal support member 103 and an insulating member 104 arranged on the bottom surface of the chamber 101. A heater 105 of a resistance heating type is buried in the mounting table 102. This heater 5 generates heat with power fed from a heater power supply (not shown), whereby the wafer W is heated to a predetermined temperature via the mounting table 102.

A gas shower head 110 functioning as an upper electrode is installed on the upper portion inside the chamber 101 so as to face the mounting table 102. The gas shower head 110 is made of metal and has a disc shape. A gas diffusion space 111 is formed inside the gas shower head 110. A number of gas discharge holes 112 are formed in the lower surface of the gas shower head 110.

A gas flow path 113 is connected to the central portion of the upper surface of the gas shower head 110. A gas pipe 113a constituting the gas flow path 113 is fixed to the chamber 101 via an insulating member 114, and the gas shower head 110 is supported in the chamber 101 by the gas pipe 113a.

Pipes 165, 166 and 167 are connected to the gas flow path 113. A $B_2H_6$ gas supply source 168 for supplying a $B_2H_6$ gas as a boron-containing gas is connected to the pipe 165, an Ar gas supply source 169 for supplying an Ar gas as a rare gas is connected to the pipe 166, and a He gas supply source 170 for supplying a He gas as a rare gas is connected to the pipe 167. The $B_2H_6$ gas, the Ar gas and the He gas reach the gas diffusion space 111 of the shower head 110 from the gas supply sources 168, 169 and 170 via the pipes 165, 166 and 167 and the gas flow path 113 and are discharged from the gas discharge holes 112 toward the wafer W in the chamber 101.

A flow rate controller 165a, such as a mass flow controller, and an opening/closing valve 165b are installed in the pipe 165, a flow rate controller 166a and an opening/closing valve 166b are installed in the pipe 166, and a flow rate controller 167a and an opening/closing valve 167b are installed in the pipe 167.

The gas shower head 110, the gas supply sources 168, 169 and 170 and the pipes 165, 166 and 167 constitute a gas supply mechanism 136.

An exhaust port 122 is installed in the lower portion of the side wall of the chamber 101, and an exhaust pipe 123 is connected to the exhaust port 122. An exhaust device 124 including a vacuum pump, an automatic pressure control valve and the like is connected to the exhaust pipe 123. By actuating the vacuum pump of the exhaust device 124, a gas in the chamber 101 is exhausted via the exhaust pipe 123, and the interior of the chamber 101 is controlled to a predetermined degree of vacuum by the automatic pressure control valve.

A loading/unloading port 125 for loading/unloading the wafer W between the chamber 101 and a vacuum transfer chamber (not shown) adjacent to the film forming apparatus 200 is installed in the side wall of the chamber 101. The loading/unloading port 125 is opened and closed by a gate valve 126.

The mounting table 102 has a plasma generating high frequency power supply 107 for supplying first high frequency power of a first frequency for plasma generation and a bias voltage applying high frequency power supply 109 for supplying second high frequency power of a second frequency, which is lower than the first frequency, for bias voltage application. The plasma generating high frequency power supply 107 is electrically connected to the mounting table 102 via a first matching device 106. The bias voltage applying high frequency power supply 109 is electrically connected to the mounting table 102 via a second matching device 108. The plasma generating high frequency power supply 107 applies the first high frequency power of 40 MHz or more, specifically 60 MHz, to the mounting table 102. The bias voltage applying high frequency power supply 109 applies the second high frequency power of 3 to 13.56 MHz, specifically 3 MHz, to the mounting table 102. The first high frequency power may be applied to the gas shower head 110. An impedance adjusting circuit 130 is connected to the gas shower head 110.

The first matching device 106 is provided to match the load impedance with the internal (or output) impedance of the plasma generating high frequency power supply 107. Specifically, when plasma is generated in the chamber 101, the first matching device 106 serves to apparently match the load impedance with the internal impedance of the plasma generating high frequency power supply 107. The second matching device 108 is provided to match the load impedance with the internal (or output) impedance of the bias voltage applying high frequency power supply 109. Specifically, when plasma is generated in the chamber 101, the second matching device 108 serves to apparently match the load impedance with the internal impedance of the bias voltage applying high frequency power supply 109.

By increasing the frequency of the plasma generating high frequency power supply 107 to 40 MHz or more and installing the impedance adjusting circuit 130, it is possible to reduce the impact of ions on the wafer W and suppress the increase in the surface roughness of the boron film.

The film forming apparatus 200 includes a control part 150. The control part 150 controls various components of the film forming apparatus 200, such as the valves, the flow rate controllers, the heater power supply, the high frequency power supplies 107 and 109 and so on. The control part 150 includes a main control part having a CPU, an input device, an output device, a display device and a storage device. A storage medium storing programs for controlling processes to be executed in the film forming apparatus 200, that is, processing recipes, is set in the storage device, and the main control part calls a predetermined processing recipe stored in the storage medium and controls the film forming apparatus 200 to perform a predetermined process based on the called processing recipe.

[Method of Forming Boron-Based Film in Second Embodiment]

Next, a method of forming a boron film as a boron-based film, which is performed in the film forming apparatus 200 configured as above will be described.

First, the gate valve 126 is opened, the wafer W is loaded into the chamber 101 and is mounted on the mounting table 102, and the gate valve 126 is closed.

The temperature of the mounting table 102 is set to 500 degrees C. or less, specifically 60 to 500 degrees C., more specifically 300 degrees C. After the chamber 101 is evacuated, an Ar gas and a He gas are flowed into the chamber 101 to perform cycle purging, and the internal pressure of the chamber 101 by the Ar gas and the He gas is set to, for example, about 400 mTorr to stabilize the temperature of the wafer W. Then, a $B_2H_6$ gas ($B_2H_6$, concentration: 10 vol %) is supplied at a flow rate of 100 to 1,000 sccm, specifically 500 sccm and an Ar gas and a He gas are supplied at a total flow rate of 100 to 1,000 sccm, specifically 500 sccm to adjust the internal pressure of the chamber 101 to 5 to 250 mTorr (0.67 to 33.3 Pa). At the same time, the first high frequency power for plasma generation is applied from the plasma generating high frequency power supply 107 to the mounting table 102 to form a high frequency electric field between the gas shower head 110 as the upper electrode and the mounting table 102 as the lower electrode to generate capacitively-coupled plasma, thereby forming a boron film by plasma CVD. The boron film formed at this time is usually amorphous boron (a-B). The deposition time of the boron film is appropriately set according to the film thickness.

Even in this embodiment, the boron film (amorphous boron a-B) formed by the plasma CVD has a higher selectivity with respect to a $SiO_2$ film or a SiN film at the time of dry etching. Further, the boron film has high resistance to many chemical solutions used for wet etching of the $SiO_2$ film and the SiN film. Therefore, by applying the boron film to a hard mask and the like, a semiconductor device can be easily manufactured.

Even in this embodiment, as in the first embodiment, by adjusting the process parameters at the time of film formation, for example, the power of the high frequency bias applied to the wafer W from the bias voltage applying high frequency power supply 109, the pressure, the temperature or the species of a gas as a processing gas supplied together with the $B_2H_6$ gas, it is possible to control the film stress of the boron film to be formed.

OTHER APPLICATIONS

Although the embodiments of the present disclosure have been described above, the present disclosure is not limited to the above-described embodiments but various modifications can be made without departing from the spirit and scope of the present disclosure.

For example, although the boron film has been mainly described as the boron-based film in the above-described embodiments, on the principle of the present disclosure, it goes without saying that the present disclosure can be applied to other boron-based films added intentionally with other additive elements to boron, such as a boron-rich BN film, a boron-rich BC film and the like. When forming a boron-based film to which other additive elements are intentionally added, a gas containing an additive element may be added as a processing gas at the time of film formation.

In the above-described embodiments, the microwave plasma CVD apparatus and the capacitively-coupled parallel plate plasma CVD apparatus have been described as examples of the film forming apparatus. However, the present disclosure is not limited thereto but may be applied to other plasma generating apparatuses.

According to the present disclosure in some embodiments, it is possible to provide a method and apparatus for forming a boron-based film, which is capable of controlling stress of the film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a boron-based film, comprising:
setting process parameters to a value for obtaining a required film stress of the boron-based film; and
subsequently, forming the boron-based film mainly containing boron on a substrate by plasma Chemical Vapor Deposition (CVD) using plasma of processing gases including a boron-containing gas and a rare gas supplied together with the boron-containing gas,
wherein the process parameters include a type of the rare gas supplied together with the boron-containing gas, and the rare gas is composed of at least one of a He gas and an Ar gas,
wherein
a proportion of the Ar gas in the rare gas relative to the He gas is set to an increased value to obtain a decreased compressive stress of the boron-based film and set to a decreased value to obtain an increased compressive stress of the boron-based film, wherein the proportion of the Ar gas in the rare gas ranges from 0% to 100% and the proportion of the He gas in the rare gas ranges from 0% to 100%.

2. The method of claim 1, wherein the compressive stress is imparted to the boron-based film by the process parameters set in the setting step.

3. The method of claim 2, wherein the process parameters include a bias voltage by high frequency power applied to the substrate when the boron-based film is formed.

4. The method of claim 2, wherein the process parameters include a pressure and/or a temperature when the boron-based film is formed.

5. The method of claim 4, wherein the compressive stress of the boron-based film increases as the pressure decreases and the temperature increases.

6. The method of claim 5, wherein a value of the compressive stress of the boron-based film is controlled to fall within a range of 100 MPa to 1,500 MPa in a pressure range of 30 mTorr (4 Pa) to 100 mTorr (13.3 Pa) and a temperature range of 200 degrees C. to 300 degrees C.

7. The method of claim 2, wherein a value of the compressive stress is controlled to fall within a range of 120 MPa to 1,800 MPa by setting a ratio of the He gas and the Ar gas in the rare gas, under a condition where a temperature is 300 degrees C., a pressure is 50 mTorr (6.67 Pa), a microwave power is 3 kW and a $B_2H_6$ gas is used as the boron-containing gas.

8. The method of claim 1, wherein the boron-based film is a film substantially composed of boron except for impurities made of materials other than boron.

9. The method of claim 1, wherein a $B_2H_6$ gas is used as the boron-containing gas.

10. The method of claim 1, wherein the plasma CVD is performed microwave plasma.

11. The method of claim 1, wherein the formation of the boron-based film is performed at a pressure of 5 mTorr (0.67 Pa) to 250 mTorr (33.3 Pa) and at a temperature of 500 degrees C. or lower.

* * * * *